US008570755B1

(12) United States Patent
Hansen et al.

(10) Patent No.: US 8,570,755 B1
(45) Date of Patent: Oct. 29, 2013

(54) USER CONFIGURABLE CONTROL PANEL LAYOUT FOR MEDICAL DEVICE

(76) Inventors: Joshua M. Hansen, Everett, WA (US); Bradley J. Sliger, Seattle, WA (US)

( * ) Notice: Subject to any disclaimer, the term of this patent is extended or adjusted under 35 U.S.C. 154(b) by 518 days.

(21) Appl. No.: 12/553,874

(22) Filed: Sep. 3, 2009

(51) Int. Cl.
*H05K 5/00* (2006.01)

(52) U.S. Cl.
USPC ............... 361/752; 361/736; 361/807; 607/5

(58) Field of Classification Search
USPC ................ 361/752, 736, 807; 607/5
See application file for complete search history.

(56) References Cited

U.S. PATENT DOCUMENTS

2006/0142808 A1* 6/2006 Pearce et al. .................. 607/5

\* cited by examiner

*Primary Examiner* — Timothy Thompson
*Assistant Examiner* — Andargie M Aychillhum
(74) *Attorney, Agent, or Firm* — Perkins Coie LLP

(57) ABSTRACT

A device has been designed that allows for modular rearrangement of groups of controls such that a user can shift control "pods" from left to right on the face of the device without changing the functionality of the device in any manner. The pods are electrically and mechanically movable from one port to another and thus pods can be designed having different control types for controlling the same function. Thus, an operator can select the operator's preferred control types for a particular set of functions and can then adapt the control panel with the operator's preference of both control type and control function location. This then allows the same device to be used by different operators one after the other with each operator being able to customize the control panel according to that operator's preferences. In one embodiment operators can rearrange the control panel in the hot mode so that the device need not be turned off.

9 Claims, 9 Drawing Sheets

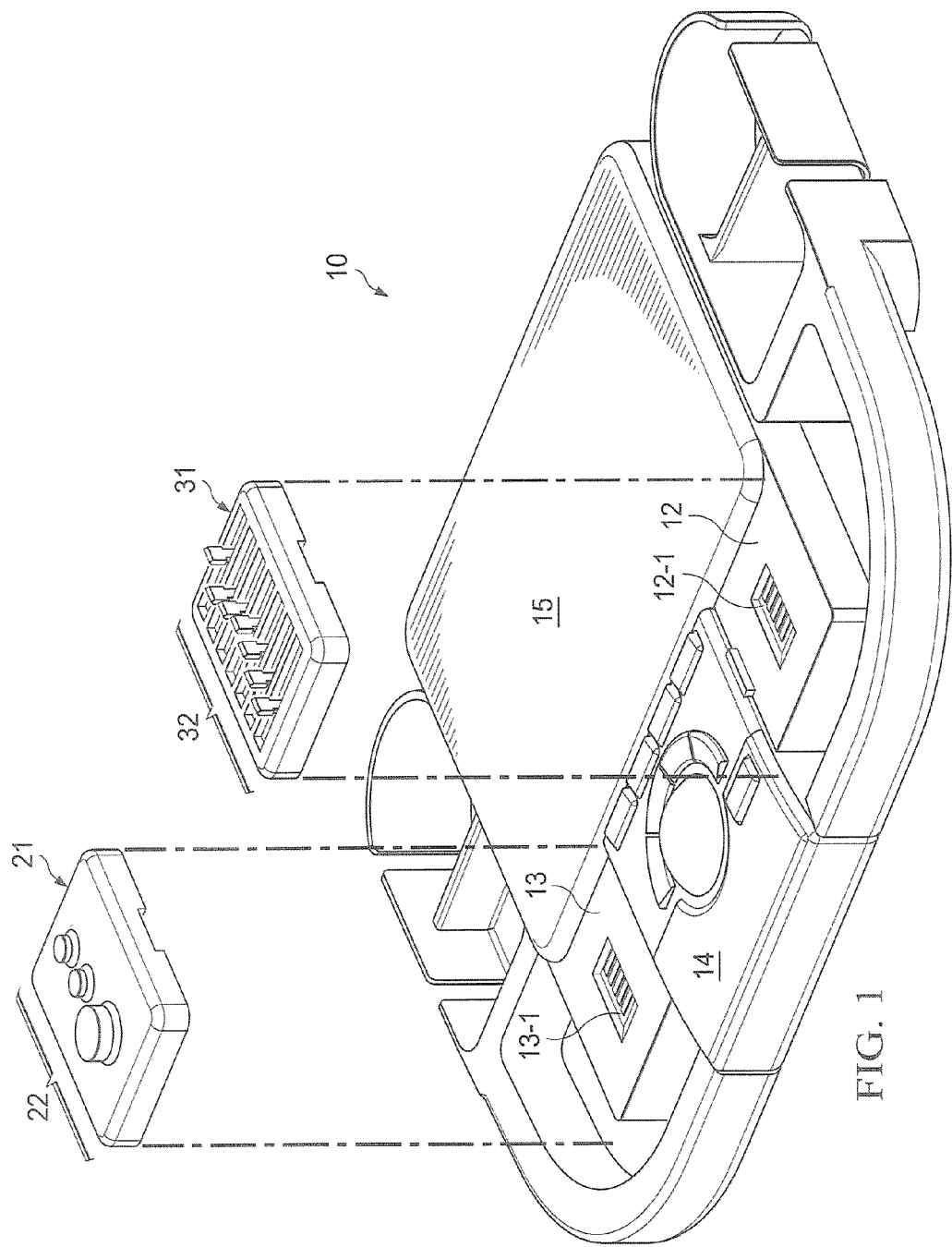

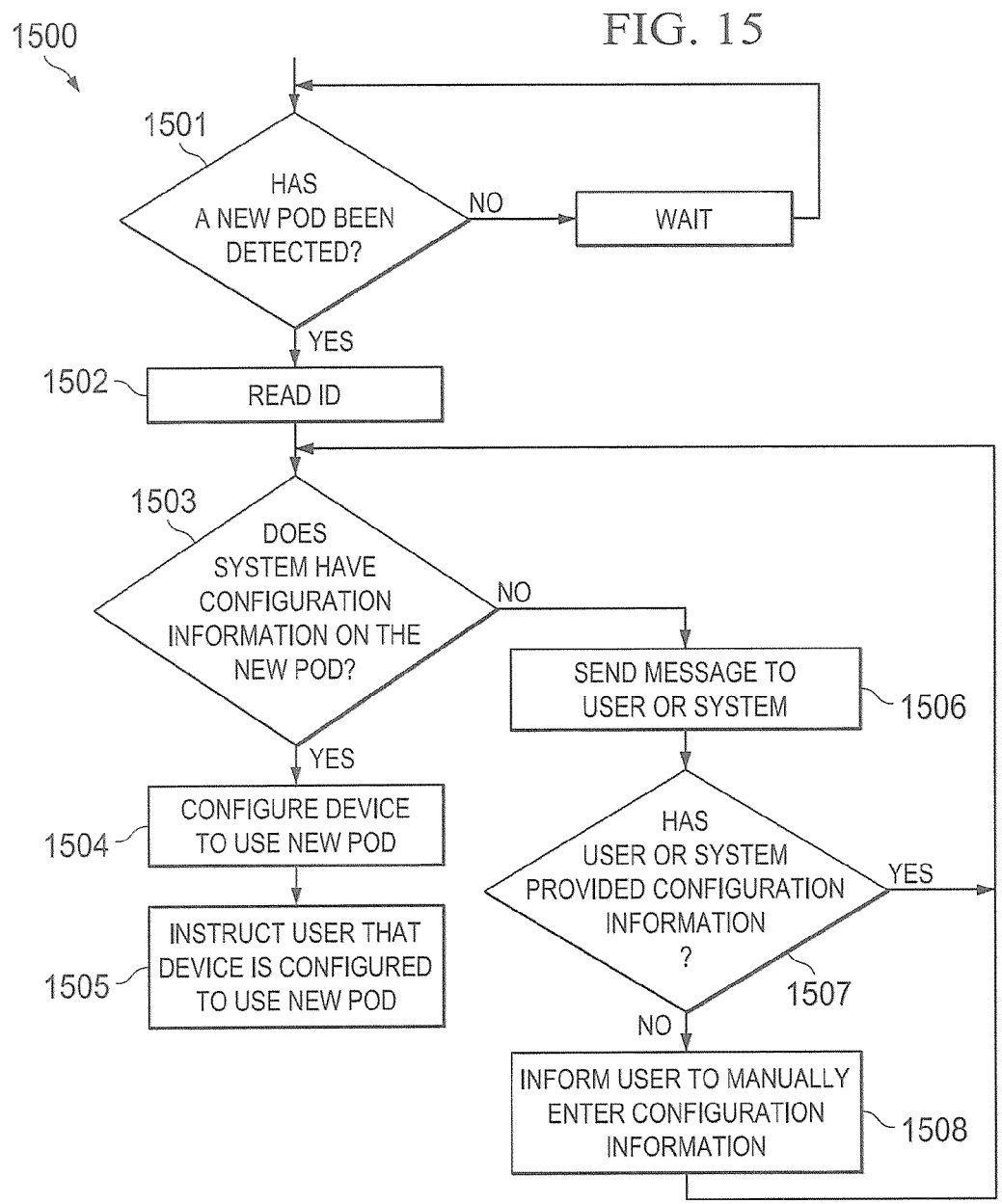

USER CONFIGURABLE CONTROL PANEL LAYOUT FOR MEDICAL DEVICE

TECHNICAL FIELD

This disclosure relates to control panel layouts and more particularly to systems and methods for user controlled control panel layouts and even more specifically to layouts that allow a user to rearrange the look and feel of a control panel.

BACKGROUND OF THE INVENTION

In certain situations, such as in the use of medical devices, operators (who often have low margin for error) develop certain preferences for how the control panel of a device is organized. These preferences pertain, for example, to whether a certain function is controlled using the left or right hands, as well as what type of control device is used to effect such control. Designers typically solve the left/right hand dichotomy by positioning "hand sensitive" switches as close to the center-line as possible. This, of course, is not always practical and even when controls are placed on or near the center of the device such a compromise is not fully satisfactory to any of the users.

An even more difficult problem to solve is the choice of switch type for a particular function. Some users may, for example, prefer slider switches while others desire rotary controls for the same function. The designer can only satisfy one of these user's preferences.

When a control type becomes obsolete, either because a newer control works better or because the function is no longer required, it is necessary to redesign the control panel and upgrade the device even though the hardware within the device has not changed. This is a costly and time-consuming problem and adds cost to the consumer. In the field of medical devices, as well as in other fields of endeavor, such costs need to be controlled.

BRIEF SUMMARY OF THE INVENTION

A device has been designed that allows for modular rearrangement of groups of controls such that a user can shift control "pods" from left to right on the face of the device without changing the functionality of the device in any manner. The pods are electrically and mechanically movable from one port to another and thus pods can be designed having different control types for controlling the same function. Thus, an operator can select the operator's preferred control types for a particular set of functions and can then adapt the control panel with the operator's preference of both control type and control function location. This then allows the same device to be used by different operators one after the other with each operator being able to customize the control panel according to that operator's preferences. In one embodiment operators can rearrange the control panel in the hot mode so that the device need not be turned off.

The same pod can be placed in different locations on the device, allowing pods to be placed on the left or the right hand side of the device or vice versa. This symmetry is designed to allow ease of use for left handed or right handed persons alike. It also allows the same or another user to use a knob pod where a switch pod could be used for the same functionality. Each individual user can select the pods and pod configurations that best suit their use. The device allows the configuration and pods to be changed whenever the user would like to change them. Thus, the same user can use different pods for different jobs. In another example, different users can use the same pods in different configurations. This ease of interchangeability allows each user to customize their own pod selection and configuration of pods.

The pods will be identified by themselves to the device or by the device itself. In one example, the pods are identified by a handshake. As soon as the pod is plugged into the device, the pod sends a digital message to the device identifying itself and that it is functional. After receiving this message, the device sends a response in which it acknowledges that it received the first message and repeats the pod type and working properly information to the pod. This handshake is performed at the plug in of each individual pod.

In another identification example, the pods will transmit their data on different frequencies into the device, so that each pod has its own frequency based on what type of device it is. This could be done physically or the pod could couple electrically with the device.

In another example, the pods are identified by the physical configuration of their electrical contacts. Each device would have a maximum number of electrical contacts, and based on the pod's electrical contact placement, the device would know what type of pod it is. In another example, the device would know what type of pod is being used by the order of signals to the device on certain contacts. The device could use the timing of the signals sent to decipher what type of pod is sending the information.

In another example, the pods are identified by an ID string that is transmitted along with information from the pod each time the pod sends information to the device. The device can differentiate pods and pod configurations based on this ID string.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 1 shows one embodiment of a system including the concepts of the present invention in one possible configuration;

FIG. 15 shows one embodiment of a method of system operation.

DETAILED DESCRIPTION OF THE INVENTION

Figure 1A:
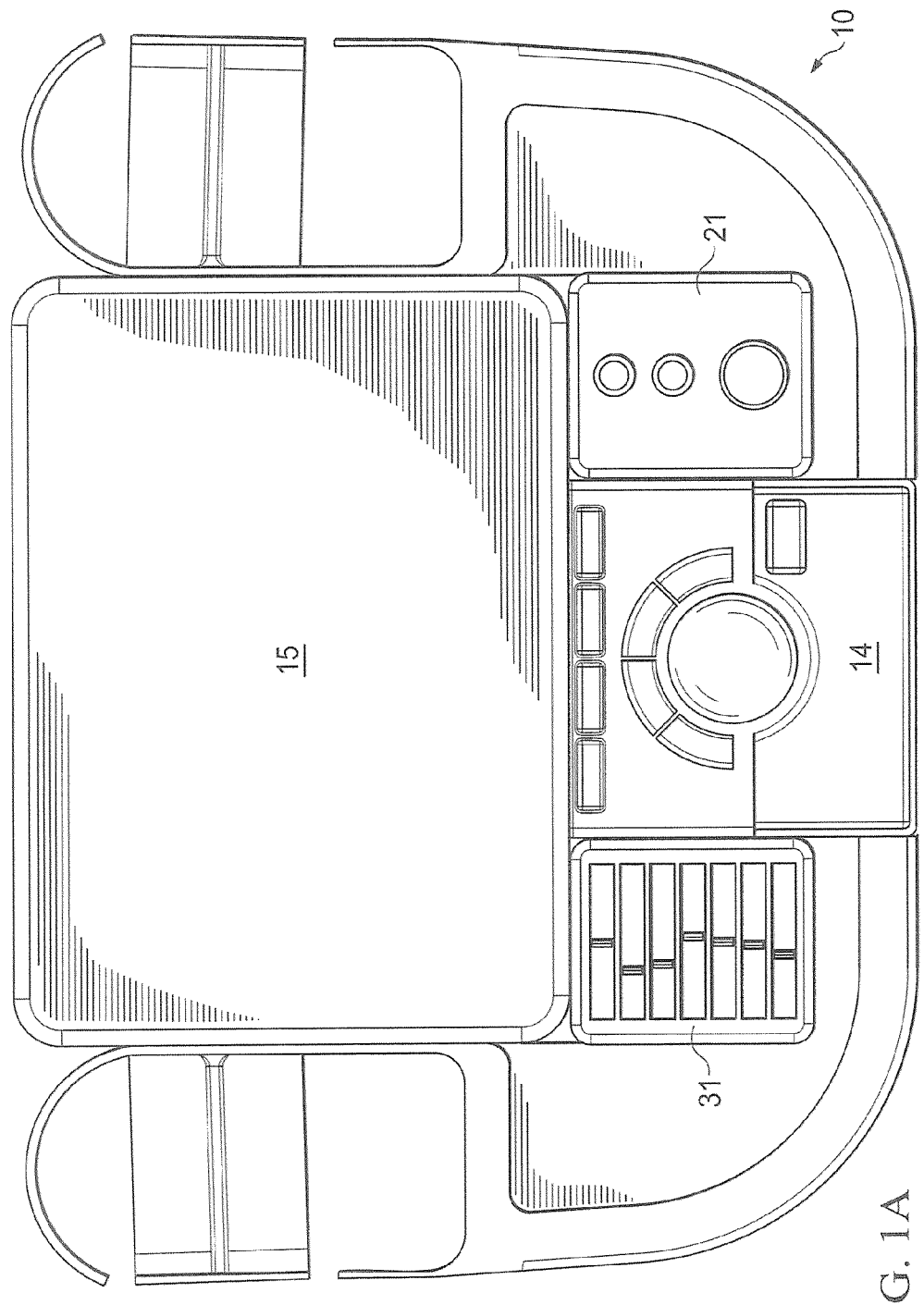
FIG. 1A shows one embodiment of a system where a knob pod is on the left and a switch pod is on the right.

FIG. 1 shows one embodiment of device 10 having pods 21 and 31 being connected thereto via ports 13 and 12 respectively. Port 12 contains mating connector 12-1, and port 13 contains mating connector 13-1. Information is sent from a pod through the mating connector to device 10. Pod 14 in FIG. 1 is shown as permanently docked to device 10, but it could be made removable as well. Output device 15 is embodied as a screen in device 10, however it could also be a removable pod.

FIG. 1A shows one embodiment of device 10 with a particular pod arrangement. Switch pod 31 has been docked on the bottom left side of device 10, and knob pod 21 has been docked on the bottom right side of device 10.

Figure 1B:
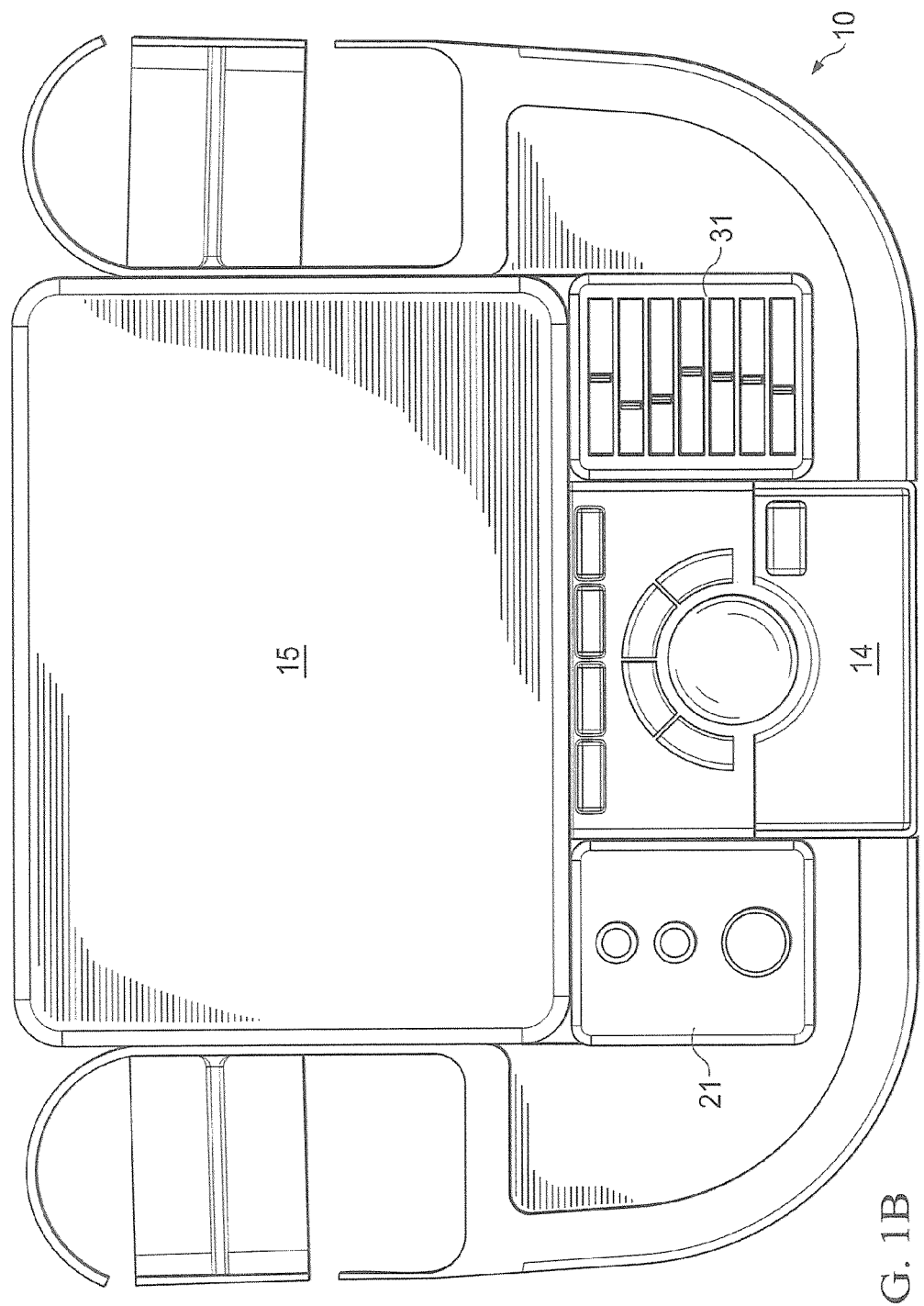
FIG. 1B shows the same embodiment as in FIG. 1A, except the switch pod and the knob pod are reversed;
}

FIG. 1B shows one embodiment of device 10 with a particular pod arrangement different from the one shown in FIG. 1A above. Knob pod 21 has been docked on the bottom left side of device 10, and switch pod 31 has been docked on the bottom right side of device 10. Note that whatever functions the knobs of pod 21 controlled in FIG. 1A, those same knobs control the same functions shown in FIG. 1B even though they are now in a different physical position.

One method for controlling the function of the various pods is to give each pod a unique identity. This can be wired into the connector pins or shared in an identity file, such as identity module 61 shown in FIG. 6. Once connected, identity module would be used, for example, by processor 601 (FIG. 6) within device 10 to set the proper functions the device on the pod will control. This can be accomplished by sharing in memory 602 (FIG. 6) the possible pod identities and the functions each pod controls. Using this arrangement, it may be necessary to program the device from time to time to respond to the different pods as they become connected. Another arrangement would be to have the identification identify each element on the pod by type so that device 10 can "see" each pod and assign specific functions to individual elements.

Figure 2:
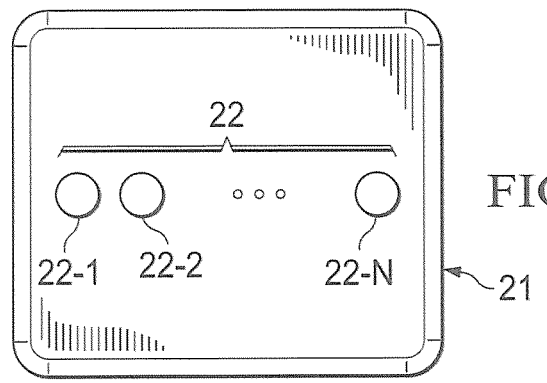
FIG. 2 shows one embodiment of a pod with rotary variable knobs.

FIG. 2 shows one embodiment of pod 21 in which rotary variable knobs are used. Pod 21 has knobs 22-1 to 22-N to control N different inputs.

Figure 3:
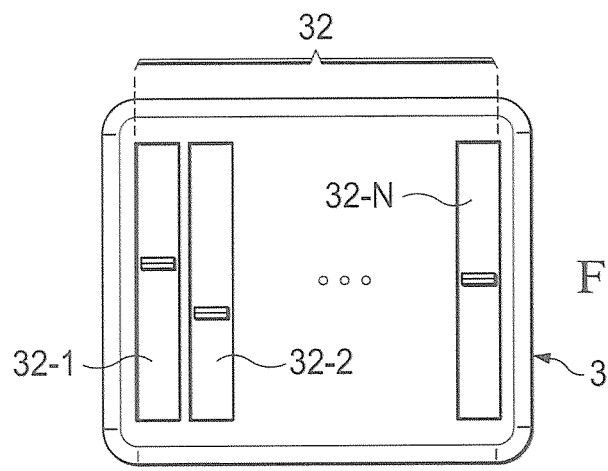
FIG. 3 shows one embodiment of a pod with sliding variable knobs.

FIG. 3 shows one embodiment of pod 31 in which sliding variable knobs are used. Pod 31 has knobs 32-1 to 32-N to control N different inputs.

Figure 4:
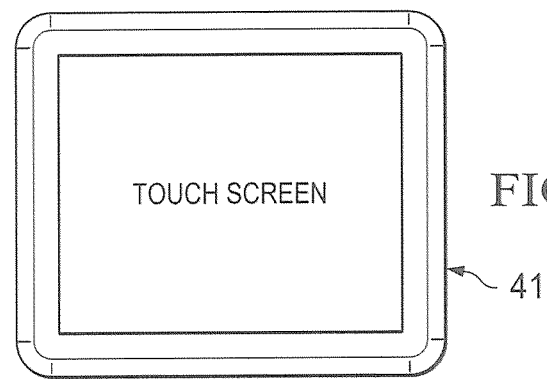
FIG. 4 shows one embodiment of a pod with a touch screen.

FIG. 4 shows one embodiment of pod 41 in which a touch controlled screen is used.

Figure 5:
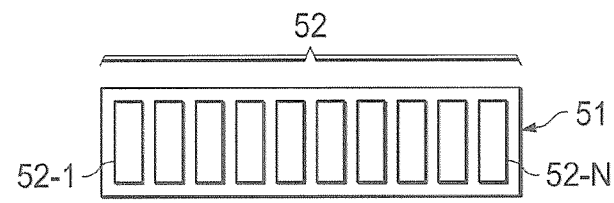
FIG. 5 shows one embodiment of a dock mating device for use in connecting pods to the main system.

FIG. 5 shows one embodiment of mating connector 51 with contacts 52. In connector 51, electrical contacts 52-1 through 52-N are shown and allow information to be passed from a pod to the system and vice versa. This can be done in any number of ways including but not limited to physical contact, electrical/magnetic ("EM") contact, close EM field transmission, EM coupling, or mechanically. Connector 51 is designed to mate with a connector, such as connector 13-1 (FIG. 1).

Figure 6:
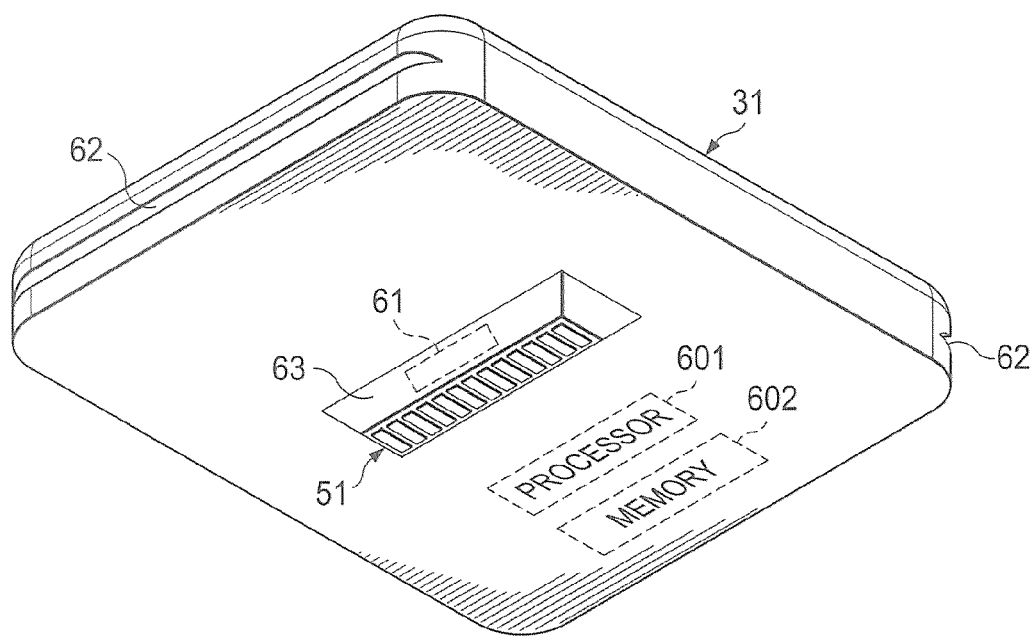
FIG. 6 shows one embodiment of a bottom view of a pod.

FIG. 6 shows one embodiment of a pod, such as pod 31, from the docking side. Latch 62 consists of at least two sets of receptors to help hold the pod in place once it is docked. Housing 63 supports connector 51 for electrical connection to device 10. Identification control 61 is shown in conjunction with connector 51.

Figure 7:
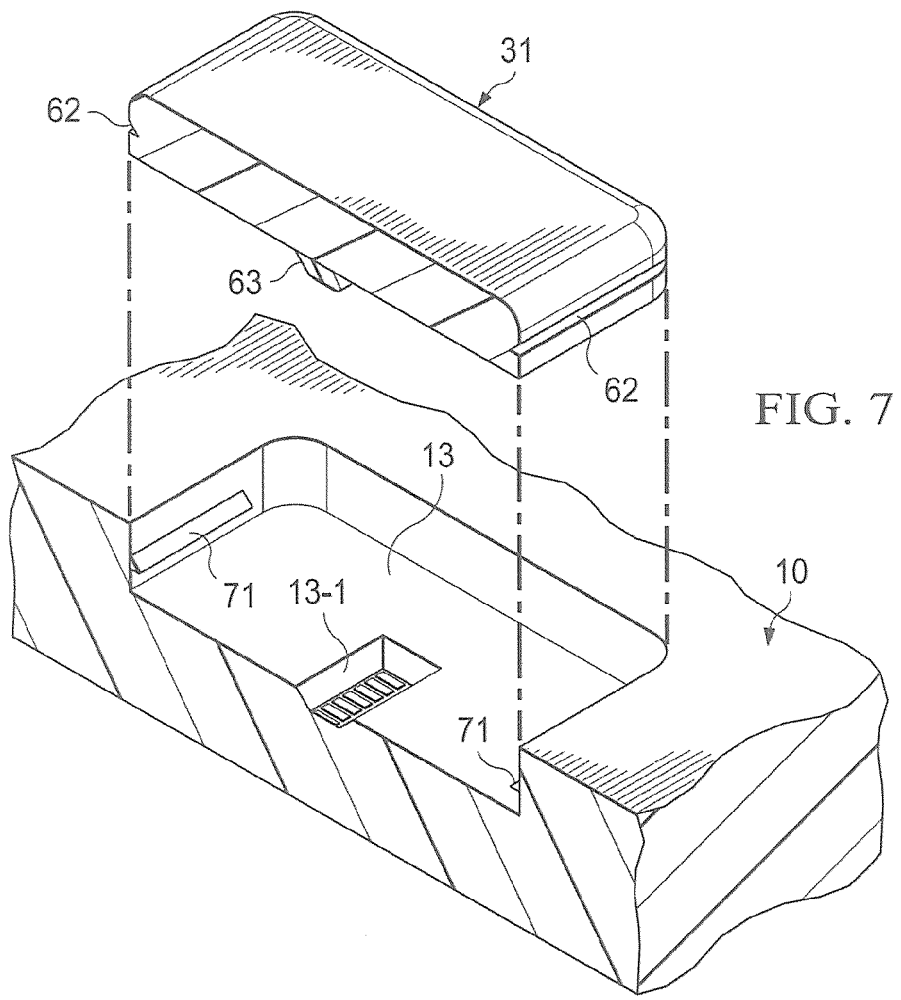
FIG. 7 illustrates a pod docking with one a device.

FIG. 7 shows one embodiment of a pod, such as pod 31, docking to device 10 through port 13. Pod 31's connector housing 63 establishes electrical contact through port 13's mating connector 13-1. Latches 62 mate with latches 71 to help hold the pod in place with port 31 on device 10.

Figure 8:
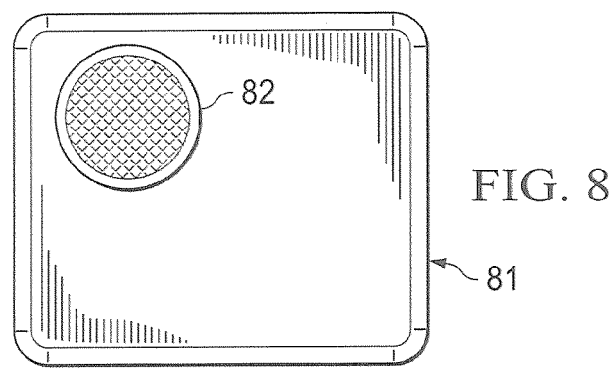
FIG. 8 shows one embodiment of a pod with voice activated control.

FIG. 8 shows one embodiment of pod 81 in which transducer 82 allows audible signals from a user to input information. Transducer 82 could also allow audible information to be sent to the user. For example, the user could issue commands to the system through transducer 82 or could have information recorded by the system. In another example, the system could then give information back to the user based on input from the user or the system could give user instructions.

Figure 9:
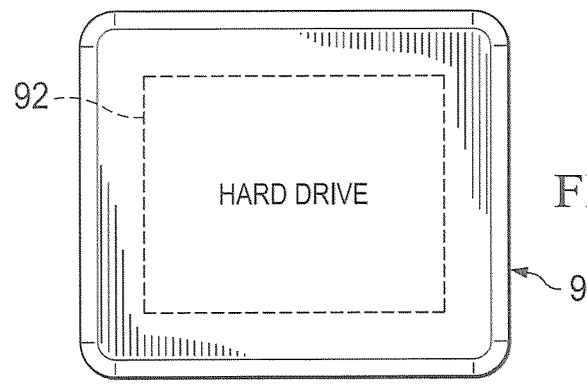
FIG. 9 shows one embodiment of a pod with a hard drive.

FIG. 9 shows one embodiment of pod 91 in which hard drive 92 is used. For example, this could be a portable hard drive capable of being used with a computer docking station, or it could be extra RAM to boost the performance of the system for certain system functions.

Figure 10:
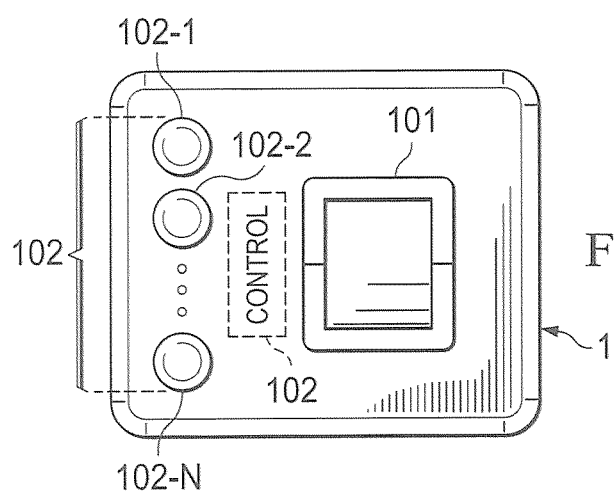
FIG. 10 shows one embodiment of a pod with a printer.

FIG. 10 shows one embodiment of pod 100 in which printer 101 is used. The printer could be controlled by control system 102, with knobs 102-1 through 102-N or by software running on device 10. Device 10 could operate all modules under control of processor 601 (FIG. 6), if desired. This printer could be capable of output in text or graphics.

Figure 11:
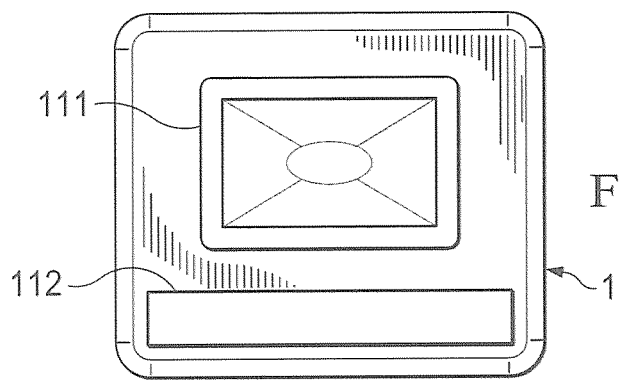
FIG. 11 shows one embodiment of a pod with a barcode scanner.

FIG. 11 shows one embodiment of pod 110 in which barcode reader 111 is used. Barcode reader 111 could scan barcodes and output device 112 could output text, audio, or other signals to the user about the item scanned.

Figure 12:
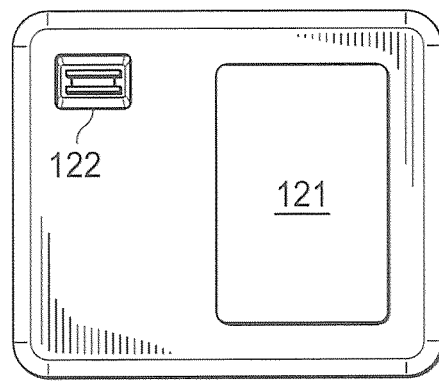
FIG. 12 shows one embodiment of a pod with a biometric scanner.

FIG. 12 shows one embodiment of pod 120 in which biometric scanner 122 is used. Biometric scanner 122 could scan fingerprints, retinas, or any other biometric information. Output device 121 could send text, graphics, or other signals to the reader as instructions or information about the scanned items.

Figure 13:
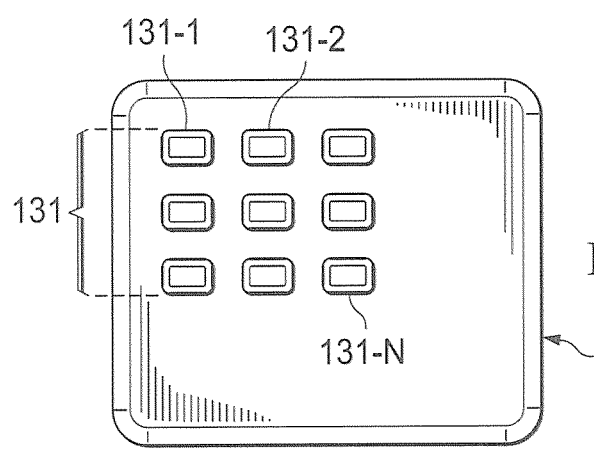
FIG. 13 shows one embodiment of a pod with a keypad.

FIG. 13 shows one embodiment of pod 130 in which keypad 131 is used. Keypad 131 is comprised of keys 131-1 to 131-N. Each key can send distinct information to the system entered by the user.

Figure 14:
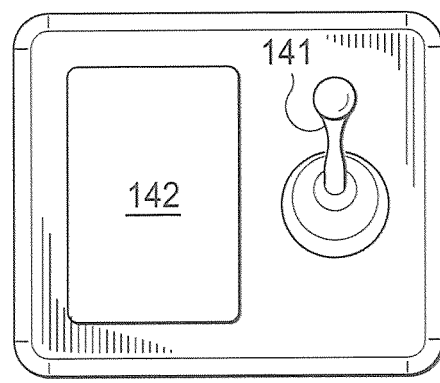
FIG. 14 shows one embodiment of a pod with a joystick.

FIG. 14 shows one embodiment of pod 140 in which joystick 141 is used. Joystick 141 can be used by the user to input information to the system, and output device 142 may give information back to the user or give the user instructions.

FIG. 15 shows one embodiment of a method, such as method 1500, of system operation. Process 1501 determines if a pod has been detected by the device. If a pod has not been detected, the system waits for a pod detection. If a pod has been detected, process 1502 receives the ID number from the pod as discussed above. In systems where only one wiring configuration is used (regardless of the key type) the system will function directly from the keypad and method 1500 is unnecessary.

Process 1503 then determines if the device has configuration information for the new pod, and if so, processes 1504 and 1505 configure the device to use the new pod and instruct the user that the device is configured to use the new pod respectively. If the pod is location sensitive, new process 1504 determines the function of the pod based upon a defined location said pod is currently plugged into. Again, this can be from a database of information stored on device 10.

If process 1503 determines that it does not have configuration information for the new pod then process 1506 sends a message to the user (or system) asking for configuration information. Process 1507 determines if the device user has provided configuration information. This could be done, for example, by uploading new software to the system, or choosing from a list of configuration files already present on the device and stored in a database (not shown). If process 1507 determines that the user has not provided configuration information, process 1508 prompts the user to manually enter configuration information for the pod.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A control pod for use on a control panel of a medical device, the control pod comprising:
   a pod housing having a shape configured to be releasably secured to a receptor location on a control panel of a medical device;
   one or more input control devices on the pod housing configured to produce signals in response to interaction with a user's hand and to supply the signals to the medical device in order to control at least one function of the medical device when the pod housing is secured to the control panel;
   at least one connector positioned on the housing for making an electrical coupling between the one or more input control devices on the pod housing and equipment within the medical device when the pod housing is secured to the control panel; and
   means for storing an identity of the control pod to identify the control pod to the medical device.

2. The control pod of claim 1, wherein the electric coupling allows information exchange between the one or more input control devices on the pod and the equipment within the device electrically, magnetically, or mechanically.

3. The control pod of claim 2, wherein the control pod includes means for transmitting information to and receiving information from a user of the medical device.

4. The control pod of claim 2, wherein the control pod is configured to be inserted in any of a number of receptor locations on the control panel of the medical device.

5. A medical device comprising:
   equipment within the medical adapted to be device controlled at least in part by one or more control devices external to the medical device;
   a control panel exterior to the medical device, the control panel having thereon a plurality of receptor locations for accepting a control pod, the control pod containing one or more input control devices; and
   a plurality of spaced-apart pod receptors each capable of receiving a control pod containing one or more input control devices that are configured to produce signals in response to interaction with a user's hand and provide the signals to the medical device in order to control at least one function of the medical device, wherein the control pod is selected from a plurality of control pods having different input control devices, the selected control pod having a reciprocal shape to a mechanical shape of the pod receptor and wherein each pod receptor includes at least one connector for coupling communications between equipment within the medical device and the one or more input control devices of a control pod that is secured to the pod receptor and for receiving information indicative of an identity of the control pod for use by the medical device.

6. The device of claim 5, wherein the coupling allows information exchange between the input control devices on the pod and the equipment within the device electrically, magnetically, or mechanically.

7. The device of claim 6, wherein a function of the medical device that is controlled by the one or more input control devices of a pod changes depending upon which of the receptor locations the pod is mated with.

8. The device of claim 6, wherein at least one pod of the plurality of control pods is configured to transmit information to and receive information from a user of the medical device.

9. The device of claim 6, wherein multiple pods having a particular control function are capable of being inserted in multiple receptors concurrently.

* * * * *

UNITED STATES PATENT AND TRADEMARK OFFICE
CERTIFICATE OF CORRECTION

| | | |
|---|---|---|
| PATENT NO. | : 8,570,755 B1 | Page 1 of 1 |
| APPLICATION NO. | : 12/553874 | |
| DATED | : October 29, 2013 | |
| INVENTOR(S) | : Hansen et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 644 days.

Signed and Sealed this
Seventh Day of April, 2015

Michelle K. Lee
*Director of the United States Patent and Trademark Office*